United States Patent [19]

Fang et al.

[11] Patent Number: 6,043,102
[45] Date of Patent: Mar. 28, 2000

[54] ASSESSING PLASMA INDUCED GATE DIELECTRIC DEGRADATION WITH STRESS INDUCED LEAKAGE CURRENT MEASUREMENTS

[75] Inventors: Peng Fang, San Jose; Jiang Tao, Fremont, both of Calif.

[73] Assignee: Advanced Micro Devices, Inc., Sunnyvale, Calif.

[21] Appl. No.: 08/924,129

[22] Filed: Sep. 5, 1997

[51] Int. Cl.[7] .................................................. H01L 21/66
[52] U.S. Cl. .............................................. 438/14; 438/17
[58] Field of Search ........................................ 438/14, 17

[56] References Cited

U.S. PATENT DOCUMENTS 5,600,578  2/1997  Fang et al. .

OTHER PUBLICATIONS

K. Naruke, S. Taguchi and M. Wada, "Stress Induced Leakage CUrrent Limiting to Scale Down EEPROM Tunnel Oxide Thickness", IEMD 88, p424–427, 1988.

Piero Olvio, Thao N. Nguyen and Bruno Ricco, "High–Field–Induced Degradation in Ultr–Thin $SiO_2$ Films", IEEE Transactions on Electron Devices, vol. 35, No. 12, Dec. 1988.

K. Eriguchi, T. Yamada, Y. Kosaka and M. Niwa, "Impacts of Plasma Process–Induced Damage on Ultra–Thin Gate Oxide Reliability", IEEE 0–7803–3575, Sep. 1997.

Hyungcheol Shin and Chenming Hu, "Monitoring Plasma–Process Induced Damage in Thin Oxide", IEEE Transactions on semiconductor Manufacturing, vol. 6, No. 2, May 1993.

"Process Induced Oxide Damage and its Implications to Device Reliability of Submicron Transistors," IEEE/IRPS 1993, pp. 293–296.

*Primary Examiner*—Charles Bowers
*Assistant Examiner*—Evan Pert

[57] ABSTRACT

Plasma induced degradation of thin gate dielectric layers, e.g., silicon dioxide layers of less than 50 Å, is assessed by impressing a constant current density across the gate dielectric layer and measuring the resulting stress induced leakage current as a function of time. The sensitivity of the stress induced leakage current to traps generated in a thin gate dielectric layer enables the use of stress induced leakage current measurements to monitor plasma induced damage during various phases of semiconductor manufacturing.

12 Claims, 2 Drawing Sheets

ASSESSING PLASMA INDUCED GATE DIELECTRIC DEGRADATION WITH STRESS INDUCED LEAKAGE CURRENT MEASUREMENTS

TECHNICAL FIELD

The present invention relates to a method of assessing plasma induced degradation of a gate dielectric layer. The present invention is particularly applicable in assessing plasma induced gate dielectric degradation of ultra thin gate dielectric layers having a thickness of less than about 50 Å in high density semiconductor device comprising design features less than about 0.25 microns.

BACKGROUND ART

During conventional semiconductor processing, plasma techniques are routinely employed, particularly in manufacturing Very Large Scale Integrated (VLSI) devices. Such conventional plasma techniques comprise etching various films, including polycrystalline silicon, oxides and metals. Plasma techniques are also conventionally employed for oxide deposition, sputter pre-clean prior to physical vapor deposition, photoresist stripping and during ion implantation. During such plasma processing, devices fabricated on silicon wafers are usually directly exposed to the plasma. Such plasma exposure is known to cause degradation of the gate dielectric layer, such as silicon oxide, e.g., silicon dioxide, in MOS devices attributed to electrical charging during the plasma process.

In the plasma ambient, metal or polycrystalline silicon electrodes serve as antennas, thereby collecting ions and electrons during plasma processing. A steady state voltage appears on the electrode due to charge collection and the resulting electrical stress is capable of destroying the underlying gate electrode by oxide breakdown or weakening it by causing charge trapping in the oxide as well as interface trap generation at the silicon dioxide-silicon interface. Since the damaged oxide may cause IC yield loss or become more vulnerable to hot-carrier induced degradation and time-dependent dielectric breakdown, plasma-induced gate oxide degradation constitutes a serious problem in VLSI technology. See, for example, Zheng et al., "A Quick Experimental Technique In Estimating The Cumulative Plasma Charging Current with MOSFET and Determining The Reliability of The Protection Diode In The Plasma Ambient," 1996 1st International Symposium on Plasma Process-Induced Damage (IEEE Cat. No. 96TH8142), 1996, pp. 27–29; H. C. Shin et al., "Thin gate oxide damage due to plasma processing," Semiconductor Science and Technology, April 1996, Vol. 11, No. 4, pp. 463–473; H. Shin et al., "Impact of Plasma Charging Damage and Diode Protection on Scaled Thin Oxide," International Electron Devices Meeting 1993, IEEE Cat. No. 93CH3361-03, 1993, pp. 467–470; and M. C. Chang et al., "Degradation of MOS Transistor Characteristics by Gate Charging Damage During Plasma Processing," International Symposium on VLSI Technology, Systems, and Applications, IEEE Cat. No. 93TH0524-9, 1993, pp. 320–324.

As integration increases and the feature size for devices decrease, the thickness of gate oxide layers decreases, thereby exacerbating the adverse impact of plasma charging damage. A conventional approach to the plasma charging damage problem comprises the formation of a protection diode to which the polycrystalline silicon layer, i.e., gate electrode/word line, is connected, thereby providing a discharge path for electrical charging during plasma processing.

Conventional practices with respect to a protection diode are attendant with numerous disadvantages, particularly in requiring extra layout area, thereby increasing the total die size and hindering miniaturization. As a result of the consequential increase in precious chip real estate, protection diodes are sparingly used, being reserved for only the most critical areas of the circuit, typically devices connected to bond pads. Copending application Ser. No. 08/798,993, filed Feb. 11, 1997, discloses a self-aligned protection diode which is formed at the first polycrystalline silicon level with a reduced layout area.

As design features shrink to smaller and smaller dimensions, it becomes increasingly more significant to quantify the degree of damage to the transistor gate dielectric layer, e.g., silicon dioxide, applicable to real circuit operating conditions, and to indicate which process steps are most damaging. One such technique is disclosed by R. Rakkhit et al., "PROCESS INDUCED OXIDE DAMAGE AND ITS IMPLICATIONS TO DEVICE RELIABILITY OF SUBMICRON TRANSISTORS," IEEE/IRPS 1993, pp. 293–296, and comprises assessing plasma induced gate dielectric damage by a "Vt-Fluence" testing technique. Vt-Fluence testing comprises the application of a constant gate current forced through the gate oxide in the Fowler-Nordheim tunneling regime for 200 seconds. The threshold voltage of the transistor is monitored periodically during the stress.

As densification increases and geometries shrink to 0.25 microns and under, e.g., 0.18 microns, the thickness of gate dielectric layers shrink to under 50 Å, e.g., under 40 Å. Moreover, as gate dielectric layers shrink to below 50 Å in thickness, the operative mechanism is no longer Fowler-Nordheim, but direct tunneling. The Vt-Fluence technique is not sensitive to detecting plasma induced damage in such ultra thin gate dielectric layers, because the leakage current becomes larger and larger due to direct tunneling vis-à-vis Fowler-Nordheim tunneling. A high field across the gate oxide does not occur with direct tunneling, since charges c an tunnel through the gate oxide at a lower field and, hence, less damage is induced due to direct tunneling. Thus, the Vt-Fluence testing method, which essentially monitors MOSFET device threshold voltage shifts due to Fowler-Nordheim tunneling, is not sensitive to significant smaller damage induced by direct tunneling.

Accordingly, there exists a need to develop a method of assessing plasma induced degradation of an ultra thin gate dielectric layer. There also exists a need to develop as to a method of determining which of various plasma processing step s during semiconductor manufacturing are most damaging in terms of gate dielectric degradation.

DISCLOSURE OF THE INVENTION

An object of the present invention is a method of assessing plasma induced degradation of an ultra thin gate dielectric layer.

Another object of the present invention is a method of assessing plasma induced degradation of an ultra thin gate dielectric layer attributed to identifiable processing steps.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of assessing plasma induced degradation of a gate dielectric layer of a semiconductor device exposed to plasma processing during manufacturing, which method comprises: applying a constant current density across the gate dielectric layer to stress the gate dielectric layer by generating a stress induced leakage current; and measuring the stress induced leakage current as a function of time.

Another aspect of the present invention is a method of assessing plasma induced degradation of a gate dielectric layer of a semiconductor device exposed to plasma processing during manufacturing, which method comprises: applying a constant current density across the gate dielectric layer to stress the gate dielectric layer and induce a leakage current; measuring the stress induced leakage current as a function of time after each of a plurality of manufacturing steps involving the use of a plasma; and assessing the relative degree of plasma degradation on the gate dielectric layer from one or more manufacturing steps.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
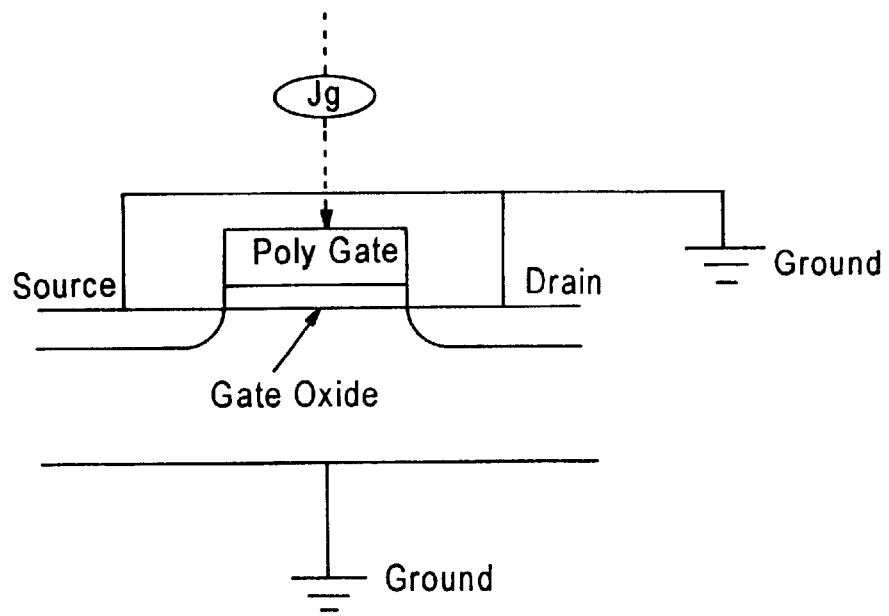
FIG. 1 schematically illustrates a testing arrangement in accordance with an embodiment of the present invention.

The present invention enables assessing plasma induced gate dielectric layer degradation, e.g., gate oxide degradation, whether the leakage current in the gate oxide is due to Fowler-Nordheim, direct tunneling or to any other mechanism, i.e., the present method is independent of the mechanism involved in generating the leakage current. Accordingly, the present invention is particularly applicable to assessing plasma degradation of ultra thin gate dielectric layers, such as gate dielectric layers having a thickness less than about 50 Å, e.g., less than about 40 Å.

Conventional Vt-Fluence testing involves forcing a certain amount of charge to pass through a gate oxide and then measuring the MOSFET threshold voltage shift before and after stressing. However, as the thickness of the gate oxide layer decreases to less than 50 Å, the Vt-Fluence testing method is not sensitive to plasma induced damage, because the leakage current becomes larger and larger due to the direct tunneling mechanism vis-a-vis Fowler-Nordheim tunneling.

In accordance with the present invention, plasma induced degradation of a gate dielectric layer, e.g., silicon oxide, is determined by a stress induced leakage testing technique wherein a constant current or current density is applied across a gate oxide layer to generate a leakage current which increases dramatically with time. The stress induced leakage current is due to trap assisted tunneling, which traps are induced during electrical stressing as current is passed through the gate oxide. Stress induced leakage current is extremely sensitive to trap generation in a gate oxide layer. The current passing through the gate oxide layer, whether by direct tunneling or Fowler-Nordheim tunneling, or by any other mechanism, generates traps in the gate oxide which cause the stress induced leakage current to increase. If the gate oxide layer has been damaged by plasma processing, i.e., plasma induced charge damage, the current will be higher than that of an undamaged gate oxide. Accordingly, the present inventive technique of measuring the stress induced leakage current can be employed to assess plasma degradation, determine which plasma processing step is the most damaging in terms of plasma induced gate oxide degradation, and to monitor plasma induced damage during production.

In an embodiment of the present invention, the stress induced leakage current is measured after each of a plurality of time periods which can be optimized for a particular dielectric layer and manufacturing regime. For example, it has been found that a plurality of time periods, each of about 5 seconds to about 200 seconds, can provide an accurate assessment of plasma induced gate dielectric degradation. In an aspect of this embodiment, the obtained stress induced leakage current measurements are compared to reference leakage current measurements. For example, reference leakage current measurements are taken of a gate dielectric layer of a semiconductor device which has not been exposed to plasma processing. Alternatively, leakage current measurements are obtained by measuring a reference gate dielectric layer which has been exposed to similar plasma processing as the gate dielectric layer undergoing assessment for plasma degradation, but has a relatively small area, e.g., up to about 100 square microns. Plasma induced damage increases as the surface area of a gate dielectric layer increases. Accordingly, a reference gate dielectric layer having a small surface area of about 100 square microns or less can be presumed to have undergone minimal plasma degradation.

In accordance with the present invention, prior to stressing, the unstressed gate oxide leakage current can be measured by varying the gate voltage and measuring the gate current to obtain a base line. Subsequently, a constant gate current density is applied to generate a stress induced leakage current which increases with time. In practicing the present invention, one having ordinary skill in the art can easily optimize the amount of current density for stressing a particular gate dielectric layer. For example, it has been found that a constant current density of about 10 mA/cm$^2$ to about 100 m/cm$^2$ is typically effective to obtain suitable stress induced leakage current measurements.

A testing layout in accordance with the present invention is schematically illustrated in FIG. 1 and comprises the application of a current (Jg) across a gate oxide layer while the source and drain regions are ground. During stressing of the gate oxide layer, a certain amount of charge is injected into the gate oxide layer over a period of time. The charge (Q) is equal to the current passing through the gate oxide (Ig)×time (t). During stressing, the current (Ig) or current density (Jg) [(Jg=Ig/gate oxide area)] is maintained constant.

Figure 3:
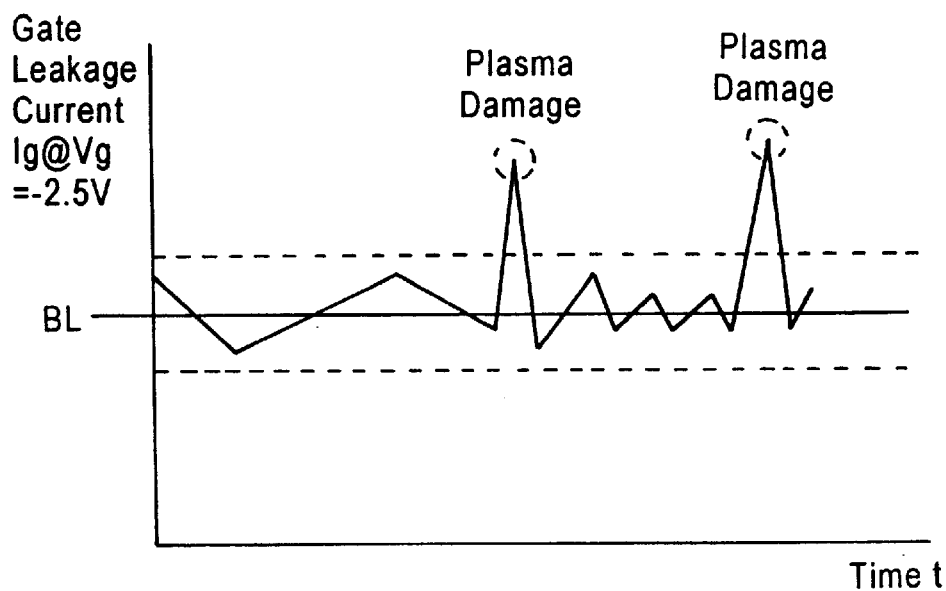
FIG. 3 illustrates the use of present invention to monitor plasma induced gate dielectric damage.
Figure 2:
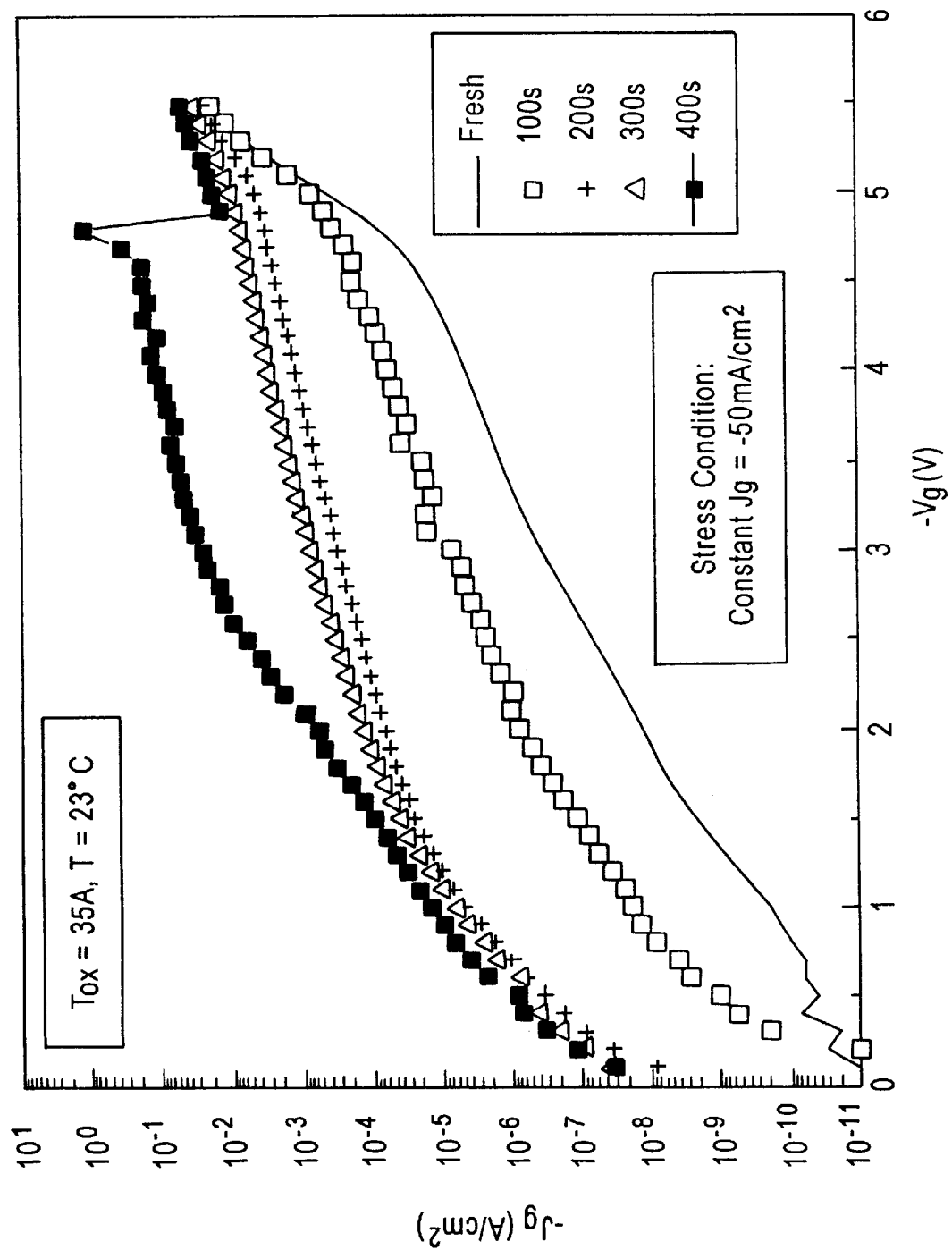
FIG. 2 is a graph showing stress induced leakage current measurements in accordance with the present invention.

Prior to stressing, a base line can be obtained employing the setup illustrated in FIG. 1, but the current source is changed to a voltage source and the gate voltage is varied while the gate current is measured to determine the base line unstressed gate leakage current. The stress measurements are subsequently taken over a period of time, preferably after a plurality of time intervals, and the stress induced leakage current plotted. Measurements on a gate oxide layer of about 35 Å taken at about room temperature, i.e., about 23° C., at intervals of about 100 seconds and at a constant current density of −50 mA/cm², are shown in FIG. 2. The initial "fresh" line illustrates the leakage current prior to stressing. FIG. 2 shows that the stress induced leakage current is very sensitive to the amount of charge injected into the gate dielectric. If plasma charge injection into the gate dielectric occurs after plasma processing, a higher stress induced leakage current will result. However, for simplicity, in accordance with the present invention, the stress induced leakage current can be measured after applying a stress of $J_g=-50$ mA/cm² for 100 seconds, at only a gate bias (e.g., $V_g=-2.5V$) and comparing the measured stress induced leakage current to the reference leakage current also stressed at a $J_g=-50$ mA/cm² for 100 seconds at the same gate bias of $V_g=-2.5V$. This is illustrated in FIG. 3, wherein a higher stress induced leakage current indicates that additional charges have been injected into the gate dielectric layer after plasma charging damage. In FIG. 3, base line 30 represents a reference leakage current. It is apparent from the reported testing that the present invention involving the use of a stress induced leakage current is capable of detecting plasma induced degradation of gate oxides having ultra thin gate oxide layers, such as 35 Å.

In another embodiment of the present invention, the relative degree of plasma induced gate dielectric degradation attributed to particular manufacturing steps is determined, thereby providing the opportunity to minimize or eliminate excessive plasma degradation. For example, in accordance with an aspect of this embodiment of the present invention, stress induced leakage current measurements are taken after each manufacturing step involving the use of a plasma. These measurements are then used to identify particularly damaging plasma manufacturing steps, and such manufacturing steps can be modified or avoided in favor of alternative techniques to reduce plasma induced degradation.

In carrying out the stress induced leakage current testing in accordance with the present invention, the testing techniques, layouts and methodology disclosed in U.S. Pat. No. 5,600,578 to Hao, Fang et al., can be employed. The entire disclosure of U.S. Pat. No. 5,600,578 is incorporated herein by reference. In U.S. Pat. No. 5,600,578, stress induced leakage current measurements are employed for predicting hot-carrier induced leakage over time in short-channel insulated gate field effect transistors.

The present invention is applicable various phases of semiconductor manufacturing involving the use of a plasma, as during etching, oxide deposition, sputter pre-clean photoresist stripping and ion implantation. The present invention is applicable to testing performed during the production of various types of semiconductor devices, particularly high density semiconductor devices having design features less than 0.25 microns, e.g., less than about 0.18 microns, and having ultra thin gate dielectric layers of less than about 50 Å, e.g., less than about 40 Å. The present invention enables the efficient manufacture of various types of semiconductor devices having minimal plasma induced gate dielectric degradation and high reliability.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of assessing plasma induced degradation of a gate dielectric layer of a semiconductor device exposed to plasma processing during manufacturing of the semiconductor device, which method comprises:

applying a constant current density across the gate dielectric layer by generating a stress induced leakage current;

measuring the stress induced leakage current as a function of time after each of a plurality of manufacturing steps involving the use of a plasma;

assessing the relative degree of plasma degradation on the gate dielectric layer from one or more manufacturing steps;

identifying a particularly damaging plasma manufacturing step; and modifying or substituting an alternative technique for the identified plasma manufacturing step.

2. The method according to claim 1, wherein the gate dielectric layer comprises silicon oxide.

3. The method according to claim 2, wherein the gate dielectric layer has a thickness less than about 50 Å.

4. The method according to claim 3, wherein the gate dielectric layer has a thickness less than about 40 Å.

5. The method according to claim 1, comprising measuring the stress induced leakage current after each of a plurality of time intervals.

6. The method according to claim 5, wherein each time interval is about 5 seconds to about 200 seconds.

7. The method according to claim 1, comprising comparing the measured stress induced leakage current to a reference leakage current over a similar time period.

8. The method according to claim 7, wherein the reference leakage current is obtained by:

applying a constant current density across a gate dielectric layer of a semiconductor device which has not been subjected to plasma processing; and measuring the leakage current as a function of time.

9. The method according to claim 7, wherein the reference leakage current is obtained by:

applying a constant current density across a reference gate dielectric layer exposed to substantially the same plasma processing as the gate dielectric layer being assessed for plasma induced gate dielectric degradation, wherein the reference gate dielectric layer has an area of about 100 square microns or less.

10. The method according to claim 1, comprising applying a constant current density across the gate dielectric layer of about 10 mA/cm² to about 1,000 mA/cm².

11. The method according to claim 1, comprising:

applying a varying gate voltage across the gate dielectric layer;

measuring the gate dielectric leakage current;

applying a constant current density across the gate dielectric layer to stress the gate dielectric layer; and measuring the resulting stress induced leakage current.

12. The method according to claim 1, comprising assessing plasma induced degradation of a gate dielectric layer during manufacturing of the semiconductor device after an exposure to plasma processing.

* * * * *